United States Patent
Chang et al.

(10) Patent No.: US 8,134,118 B2
(45) Date of Patent: Mar. 13, 2012

(54) IMAGE CAPTURE UNIT AND METHODS OF FABRICATING A LENS ARRAY BLOCK UTILIZING ELECTROLYSIS

(75) Inventors: Chao-Chi Chang, Suzhou (CN); Yung-I Chen, Taipei (TW); Jean-Pierre Lusinchi, Suzhou (CN); Raymond Chih-Chung Hsiao, Milpitas, CA (US)

(73) Assignee: Ether Precision, Inc. (KY)

( * ) Notice: Subject to any disclaimer, the term of this patent is extended or adjusted under 35 U.S.C. 154(b) by 0 days.

(21) Appl. No.: 13/219,589

(22) Filed: Aug. 26, 2011

(65) Prior Publication Data
US 2011/0310281 A1  Dec. 22, 2011

Related U.S. Application Data

(62) Division of application No. 11/925,742, filed on Oct. 26, 2007, now Pat. No. 8,013,289.

(30) Foreign Application Priority Data

| Nov. 15, 2006 | (TW) | ............................... 95142246 A |
| Dec. 29, 2006 | (TW) | ............................... 95223188 U |
| May 8, 2007 | (TW) | ............................... 96116333 A |
| Jun. 21, 2007 | (TW) | ............................... 96122374 A |

(51) Int. Cl.
*H01J 40/14* (2006.01)
*H01J 3/14* (2006.01)

(52) U.S. Cl. ...................... 250/239; 250/216

(58) Field of Classification Search ............... 250/208.1, 250/239, 216; 358/454, 494, 496; 257/433, 257/434, 678, 680, 685, 686, 723; 438/64–66, 438/106, 116

See application file for complete search history.

(56) References Cited

U.S. PATENT DOCUMENTS

| 4,411,490 A | 10/1983 | Daniel |
| 4,416,513 A | 11/1983 | Uesugi |
| 4,432,022 A | 2/1984 | Tokumitsu |
| 4,473,284 A | 9/1984 | Hiramatsu et al. |
| 4,583,126 A | 4/1986 | Stoffel |
| 5,399,850 A | 3/1995 | Nagatani et al. |
| 5,444,520 A | 8/1995 | Murano |
| 5,570,231 A | 10/1996 | Mogamiya |
| 5,617,131 A | 4/1997 | Murano et al. |
| 5,661,540 A | 8/1997 | Kaihotsu et al. |

(Continued)

FOREIGN PATENT DOCUMENTS
CN         1910754 A     2/2007
(Continued)

OTHER PUBLICATIONS

Chen, Yajuan PCT International Search Report and Written Opinion from PCT Appl. No. PCT/CN2010/000918 Oct. 21, 2010, Beijing, China.

(Continued)

*Primary Examiner* — Que T Le
*Assistant Examiner* — Pascal M Bui Pho
(74) *Attorney, Agent, or Firm* — Ashok K. Janah; Janah & Associates, P.C.

(57) ABSTRACT

Methods of forming a lens array block comprising a plurality of lens barrels are provided, including depositing lens barrel material by electrolysis and etching lens barrels from a block of material. Also provided are means of assembling image capturing units or arrays of image capturing units.

13 Claims, 9 Drawing Sheets

U.S. PATENT DOCUMENTS

| | | | |
|---|---|---|---|
| 5,699,200 | A | 12/1997 | Uno et al. |
| 6,002,459 | A | 12/1999 | Kaise et al. |
| 6,449,106 | B1 | 9/2002 | Spinali |
| 6,665,455 | B1 | 12/2003 | Ting |
| 6,683,298 | B1 | 1/2004 | Hunter et al. |
| 6,747,805 | B2 | 6/2004 | Sayag |
| 6,809,868 | B2 | 10/2004 | Ogi et al. |
| 6,822,803 | B2 | 11/2004 | Muto et al. |
| 6,909,121 | B2 * | 6/2005 | Nishikawa ............ 257/88 |
| 6,917,757 | B1 | 7/2005 | Chang |
| 7,112,864 | B2 | 9/2006 | Tsukamoto et al. |
| 7,116,484 | B2 | 10/2006 | Nemeto et al. |
| 7,158,170 | B2 | 1/2007 | Gustavsson et al. |
| 7,158,316 | B2 | 1/2007 | Chang et al. |
| 7,166,907 | B2 | 1/2007 | Onishi et al. |
| 7,177,082 | B2 | 2/2007 | Wakisaka et al. |
| 7,187,501 | B2 | 3/2007 | Wakisaka |
| 7,199,359 | B2 | 4/2007 | Webster |
| 7,215,479 | B1 | 5/2007 | Bakin |
| 7,262,927 | B1 | 8/2007 | Shyu et al. |
| 7,330,211 | B2 | 2/2008 | Vook et al. |
| 7,338,159 | B2 | 3/2008 | Spivey |
| 7,352,511 | B2 | 4/2008 | Boettiger et al. |
| 7,360,422 | B2 | 4/2008 | Madni et al. |
| 7,375,893 | B2 | 5/2008 | Toyoda |
| 7,379,113 | B2 | 5/2008 | Kong et al. |
| 7,411,749 | B2 | 8/2008 | Liu |
| 7,545,588 | B2 | 6/2009 | Hua |
| 7,813,043 | B2 | 10/2010 | Lucinchi et al. |
| 2002/0071190 | A1 | 6/2002 | Wada et al. |
| 2002/0144905 | A1 | 10/2002 | Schmidt |
| 2004/0061799 | A1 | 4/2004 | Atarashi et al. |
| 2004/0095502 | A1 | 5/2004 | Losehand et al. |
| 2004/0109079 | A1 | 6/2004 | Fujimoto et al. |
| 2004/0227848 | A1 | 11/2004 | Tan et al. |
| 2005/0041098 | A1 | 2/2005 | Tan et al. |
| 2005/0067286 | A1 * | 3/2005 | Ahn et al. ............ 205/70 |
| 2005/0162538 | A1 | 7/2005 | Kurosawa |
| 2005/0275741 | A1 | 12/2005 | Watanabe et al. |
| 2006/0006486 | A1 | 1/2006 | Seo et al. |
| 2006/0035415 | A1 * | 2/2006 | Wood et al. ............ 438/125 |
| 2006/0043262 | A1 | 3/2006 | Akram |
| 2006/0171047 | A1 | 8/2006 | Yen et al. |
| 2006/0179887 | A1 | 8/2006 | Lung et al. |
| 2006/0252246 | A1 | 11/2006 | Paik et al. |
| 2007/0045517 | A1 | 3/2007 | Fukuyoshi et al. |
| 2007/0069108 | A1 | 3/2007 | Inaba |
| 2007/0139795 | A1 | 6/2007 | Li |
| 2007/0186589 | A1 | 8/2007 | Lung |
| 2007/0296847 | A1 | 12/2007 | Chang et al. |
| 2008/0115880 | A1 | 5/2008 | Chang et al. |
| 2008/0121784 | A1 | 5/2008 | Chang et al. |
| 2008/0158698 | A1 | 7/2008 | Chang et al. |
| 2008/0309812 | A1 | 12/2008 | Chen et al. |
| 2009/0116096 | A1 | 5/2009 | Zalevsky et al. |
| 2010/0039713 | A1 | 2/2010 | Lusinchi |
| 2010/0322610 | A1 | 12/2010 | Lucinchi |

FOREIGN PATENT DOCUMENTS

| | | |
|---|---|---|
| WO | WO-03/009040 A1 | 1/2003 |
| WO | WO-2007/014293 | 2/2007 |

OTHER PUBLICATIONS

Kunnavakkam et al., "Low-cost, low-loss microlens arrays fabricated by soft lithography replication process", Applied Physics Letters, vol. 82, No. 8, pp. 1152-1154, Feb. 2003.

Fuller, Rodney Evan, USPTO Office Action dated Aug. 5, 2010 in U.S. Appl. No. 12/490,297.

Hasan, Mohammed A USPTO Office Action dated Nov. 9, 2007 in U.S. Appl. No. 11/703,840 (US 7411749).

Khan, Usman A USPTO Office Action dated Jan. 7, 2010 in U.S. Appl. No. 11/774,646.

Loha, Ben, USPTO Final Office Action Dated Mar. 6, 2009 in U.S. Appl. No. 11/769,805 (US 2008-0158698 A1).

Loha, Ben, USPTO Office Action Dated Sep. 2, 2008 in U.S. Appl. No. 11/769,805 (US 2008-0158698 A1).

Sahu, Meenakshi S., USPTO Office Action Dated Jun. 10, 2009 in U.S. Appl. No. 11/640,249 (US 2008-0115880 A1).

Thompson, Timothy J., USPTO Office Action Dated Aug. 28, 2008 in U.S. Appl. No. 11/640,257 (issued as US 7,545,588).

Yam, Stephen K USPTO Final Office Action dated Nov. 27, 2009 in U.S. Appl. No. 11/925,742.

Yam, Stephen K USPTO Office Action dated Aug. 11, 2008 U.S. Appl. No. 11/925,742.

Yam, Stephen K USPTO Office Action dated Oct. 27, 2008 in U.S. Appl. No. 11/925,742.

Yam, Stephen K, USPTO Office Action dated Feb. 23, 2009 in U.S. Appl. No. 11/925,742 (US 2008/0121784 A1).

* cited by examiner

IMAGE CAPTURE UNIT AND METHODS OF FABRICATING A LENS ARRAY BLOCK UTILIZING ELECTROLYSIS

CROSS-REFERENCE

This application is a divisional of U.S. patent application Ser. No. 11/925,742 filed on Oct. 26, 2007 now U.S. Pat. No. 8,013,289, which claims priority from Taiwan Patent Application no. TW95142246, filed Nov. 15, 2006; Taiwan Patent Application no. TW96116333, filed May 8, 2007; Taiwan Patent Application no. TW96122374, filed Jun. 21, 2007; and Taiwan Model Application no. TW95223188, filed Dec. 29, 2006; all of which are incorporated herein by reference in their entireties.

BACKGROUND

Embodiments of the present invention relate to an image capture unit and methods of manufacture.

Figure 1:
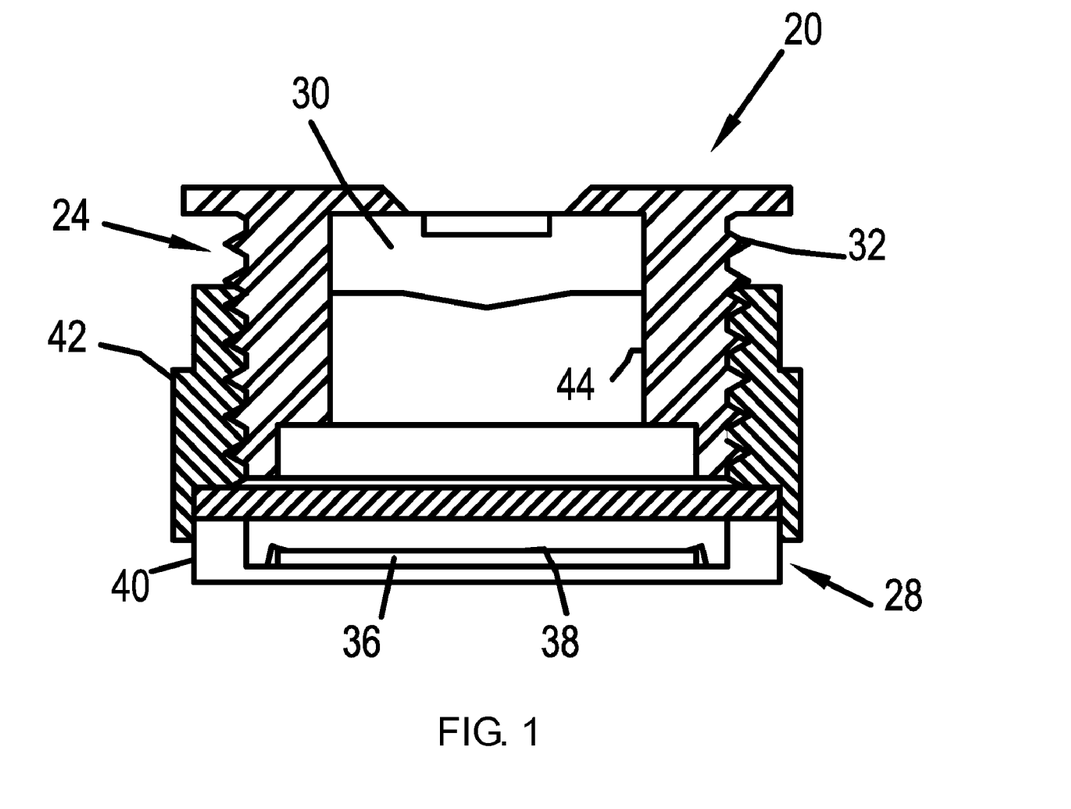
FIG. 1 (PRIOR ART) is a schematic sectional side view a conventional image capturing unit comprising a lens module attached to a packaged image sensor.

An image capturing unit 20 comprises a lens module 24 which directs an image onto an image sensor 28, as shown in FIG. 1. The lens module 24 comprises a lens 30 mounted in a lens barrel 32. The image sensor 28 comprises a CCD or CMOS array 36 having an image receiving side 38 that converts an incident image, which may be light, infra-red or other radiation, into an electronic signal. Typically, the image sensor 28 is enclosed in a package 40, and is fabricated by chip on board (COB), tape carrier package (TCP), or chip on glass (COG) methods. A holder 42 joins and aligns the lens module 24 to the image sensor package 40. The image capture unit 20 is used in, for example, electronic devices such as mobile phones, personal digital assistants, remote sensors, signal transmitting cameras; medical devices; and such applications such as lens for car security system.

However, it is difficult to fabricate conventional image units 20 at ever smaller sizes while still providing structural integrity, reliability, and ease of manufacturing and assembly. For example, conventional lens barrels 32 and the holders 42 are often made of injection molded plastic to facilitate mass production. However, injection molded lens barrels 32 and holders 42 are often difficult to fabricate to the precise dimensions needed to hold and align very small lenses having diameters of less than 1.5 mm. In addition, injection molding processes often form undesirable artifacts on the surfaces of the lens barrel 32, such as bumps and rounds, which interfere with subsequent assembly of a lens 30 into the lens barrel 32 and can even cause the lens to deviate from its proper position. Also, such plastic components often cannot withstand the high temperatures needed for fabricating other structures of the image capture units, such as for example, the temperatures used in semiconductor fabrication process such as a reflow process in wafer level packaging.

It is also often difficult to align or correctly position a lens 30 in a lens barrel 32 during manufacturing. In one process, a scale is printed on the inside surface 44 of the lens barrel 32 and the lens 30 is positioned to a point on the scale. However, even with this method, it is often difficult to properly position the lens 30 at an exact position on the scale as it is difficult to read the scale from outside the lens barrel 32. Further, it is even more difficult to position multiple lenses 30 in a lens barrel 32, as the individual lenses can be misaligned relative to one another or to the image receiving surface 38 of the image sensor 28.

Conventional image capturing units 20 are also difficult to assemble with proper alignment of the lens modules 24 and image sensors 28. For example, during assembly of the lens module 24 to an image sensor 28, fine dust falling on the image receiving surface 36 of the image sensor 28 can contaminate the surface and give rise to marks on resultant image signals. In addition, assembly of each image capturing unit 20 by manually assembling each lens 30 in a lens barrel 32, and then attaching the lens barrel 32 to an image sensor 28, is also labor intensive and involves many fine alignment steps during which one or more of the components can become misaligned. Alignment and contamination problems can also arise during assembly of a completed lens module 24 to a package 40 containing an image sensor 28, and attachment with an adhesive. The lens 30 has to be mounted at a precise distance from the image receiving surface 38 of the image sensor 28 to provide a suitable focal length. However, such assembly processes often fail to provide the precise alignment or distance of each lens module 24 and image sensor 28.

Thus it is desirable to have image capture units with lens and lens modules which have small sizes and precise dimensions. It is also desirable to have a method of manufacturing the lens modules that facilitates alignment of a lens in a lens barrel. It is also desirable to have a method attaching and aligning a lens module to an image sensor which reduces contamination, provides good alignment and focal distances, and still maintains a reasonable cost of assembly and fabrication.

SUMMARY

A method of forming a lens array block comprises providing a backing plate having a surface, and forming on the surface of the backing plate, a first mask pattern comprising an array of first solid circles that each have a first diameter. Lens barrel material is deposited by electrolysis around the first solid circles to form a first lens barrel level containing a plurality of first holes. A second mask pattern comprising an array of second solid circles that each have a second diameter, is then formed on the surface of the first lens barrel level. Lens barrel material is then deposited by electrolysis around the second solid circles to form a second lens barrel level containing a plurality of second holes that each have a common central axis with a first hole.

An array of image capturing units includes an image sensor array comprising a plurality of image sensors which are spaced apart from one another, each image sensor comprising an image receiving surface; a light permeable cover positioned over the image receiving surfaces of the image sensor array; and a lens array block positioned over the light permeable cover, the lens array block comprising a plurality of lens barrel, wherein each lens barrel is aligned to an image receiving surface of an image sensor.

A method of fabricating an array of image capturing units, comprises providing an image sensor array comprising a plurality of image sensors which are spaced apart from one another, each image sensor comprising an image receiving surface. A light permeable cover is positioned over the image receiving surfaces of the image sensor array. A lens array block comprising a plurality of lens barrel is positioned over the light permeable cover such that each lens barrel is aligned to an image receiving surface of an image sensor.

In another method of fabricating an array of image capturing units, a lens array block comprising a plurality of lens barrels and top and bottom surfaces is used. At least one lens is mounted in each lens barrel of the lens array block, each lens barrel having a circumferential edge. A mask cover having a plurality of apertures is positioned over the top surface of the lens array block such that each aperture is aligned to a lens barrels to at least partially shield the circumferential edge of the lens in the lens barrel block. An image sensor array is attached to the bottom surface of the lens array block such that an image receiving surface of each image sensor is aligned to a lens barrel.

In yet another method of fabricating an array of image capturing units, the method comprises providing a wafer comprising an image sensor array having a plurality of image sensors, each image sensor comprising an image receiving surface. A plurality of lens modules is attached to the wafer such that each optical lens module is aligned to an image receiving surface of an image sensor. The wafer is divided to form a plurality of image capture units, each image capture unit comprising an image sensor and a lens module.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 2:
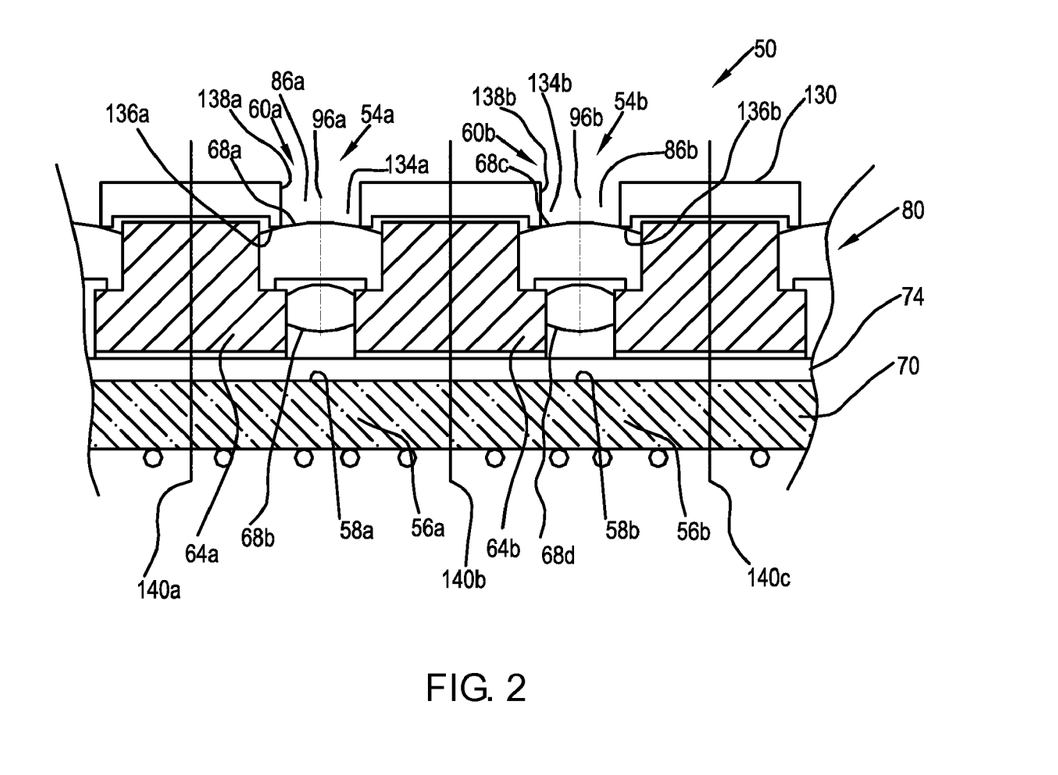
FIG. 2 is a schematic sectional side view of an image capturing unit array comprising a plurality of image capturing units that each comprise a lens module aligned to an image sensor.

An image capturing unit array 50 comprises a plurality of image capturing units 54a,b which are spaced apart from one another and arranged in a periodic relationship, as shown in FIG. 2. In the array 50, each image capturing unit 54a,b comprises an image sensor 56a,b having an image receiving surface 58a,b, and a lens module 60a,b comprising a lens barrel 64a,b having one or more lenses 68a-d which direct and focus light onto image the receiving surface 58a,b of the image sensors 56a,b. Each image capturing unit 54a,b can be used in a variety of different devices to capture photons or other radiation and to record an external image on the image receiving surface 58a,b, and convert the received image to an electrical signal trace for further processing. The image capturing units 54a,b can be fabricated as an image capturing unit array 50 as shown and then cut to form separate units.

In one method of fabrication, the image capturing unit array 50 is fabricated using an image sensor array 70 which has a plurality of image sensors 56a,b which are spaced apart from one another in a periodic arrangement. An image sensor 56a,b can comprise, for example, a one or more light sensing chips which are spaced apart from one another. For example, each image sensor 56a,b may include a plurality of light sensing chips arranged in a 2*2 or a 2*3 array. Suitable image sensors 56a,b can be, for example, a CMOS or CCD sensor.

A light permeable cover 74 is positioned over the plane of image receiving surfaces 58 of the image sensor array 70. The light permeable cover 74 is substantially permeable to radiation, such as optical wavelengths of light, or other types of radiation. For example, the light permeable cover 74 can allow at least 90% of normally incident light to pass through. In one aspect, the light permeable cover 74 comprises a protective cover which provides a cover to reduce moisture or dust contamination of the image receiving surfaces 58. The protective cover is a planar, for example, a plate. In another aspect, the light permeable cover 74 serves as radiation filter, such as an infrared filter which absorbs at least about 30% of radiation having wavelengths in the infrared range. The light permeable cover 74 can be made, for example, from a sheet of silicon oxide, silicon nitride, or glass.

A lens array block 80 is positioned over the light permeable cover 74. An embodiment of a lens array block 80 comprising a plurality of the lens barrels 64a,b which are joined together to form a three-dimensional unitary structure, is shown in FIG. 2. The three-dimensional unitary structure is absent separating interfaces between adjacent lens barrels 64a,b in at least one dimension, such as for example, within a horizontal direction through the plane of the lens array block 80.

Figure 3:
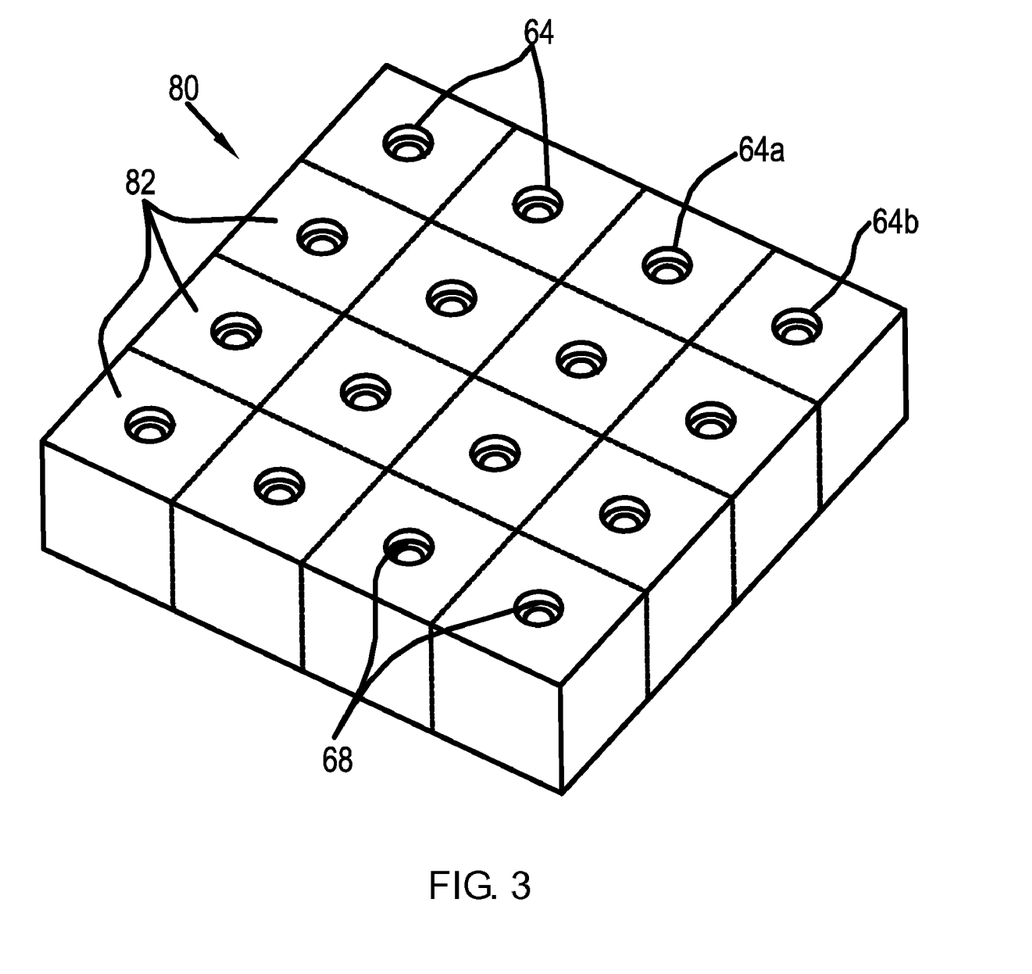
FIG. 3 is a schematic perspective view of a lens array block comprising a plurality of the lens barrels that are joined together to form a three-dimensional unitary structure.

In one version, the lens array block 80 comprises a periodic arrangement of the cubes 82 that each contain a lens barrel 64, as shown in FIG. 3. The cubes 82 can be rectangular or square, and are joined together at side surfaces to form an array. The cubes 82 can be made from a dielectric, semiconductor or conductor material which has a sufficient mechanical strength to support a lens 68 within a lens barrel 64, and which is capable of being fabricated with a smooth internal surface for holding the lenses 68. Suitable materials include a dielectric, semiconductor, or metal, including for example, glass such as silicate or borosilicate glass; ceramic such as aluminum oxide or silicon dioxide; metal such as titanium and stainless steel; semiconductor such as silicon wafers, gallium arsenide and indium phosphide; or even polymers such as plastic or polyimide and heat-resistant plastic.

Figure 4A:
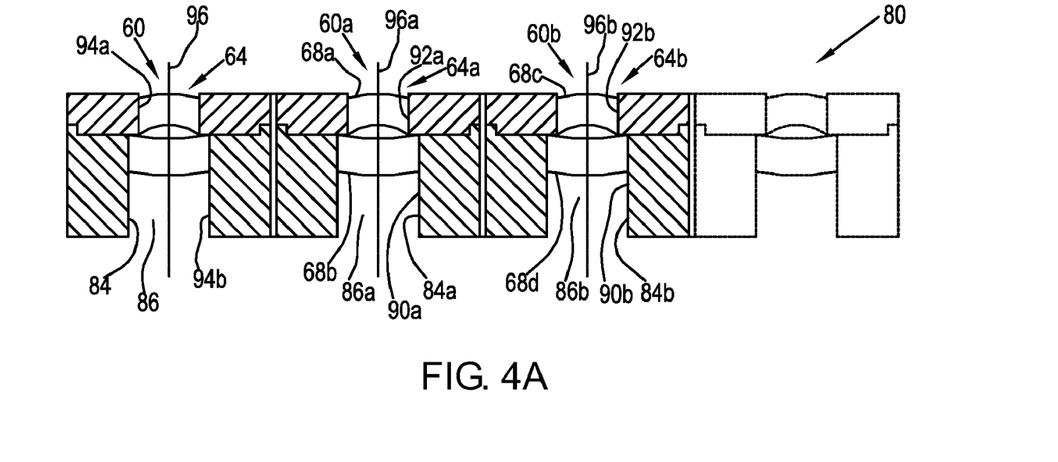
FIGS. 4A to 4B are schematic sectional side views of an assembled (FIG. 4A) and exploded (FIG. 4B) embodiment of a lens array block made from plates and comprising an alignment system.

Referring to the illustrative embodiment shown in FIG. 4A, the lens array block 80 comprises a plurality of lens barrels 64a,b that each comprise a stepped cylindrical chamber 84a,b comprising a through hole 86a,b having an internal profile contour having at least a first step 90a,b and a second step 92a,b, the second step 92a,b being radially inward of the first step 90a,b through the height of the through hole 86a,b. Each stepped cylindrical chamber 84 is defined by a series of concentric cylinders 94a,b which are stacked upon one another and which have a common central axis 96. In the version shown, the stepped cylindrical chamber 84 comprises a through hole 86 having a plurality of different diameters, for example, two consecutive diameters, such as a first and second diameter. While an exemplary embodiment of a lens barrel 64 having a cylindrical axis of symmetry such as the axis 96 is described herein to illustrate the present structures and processes, it should be understood that other lens barrel 64 configurations can also be used. For example, the lens barrel 64 can also be shaped to surround a through hole 86 which is rectangular, spherical, or even conical.

Figure 4B:
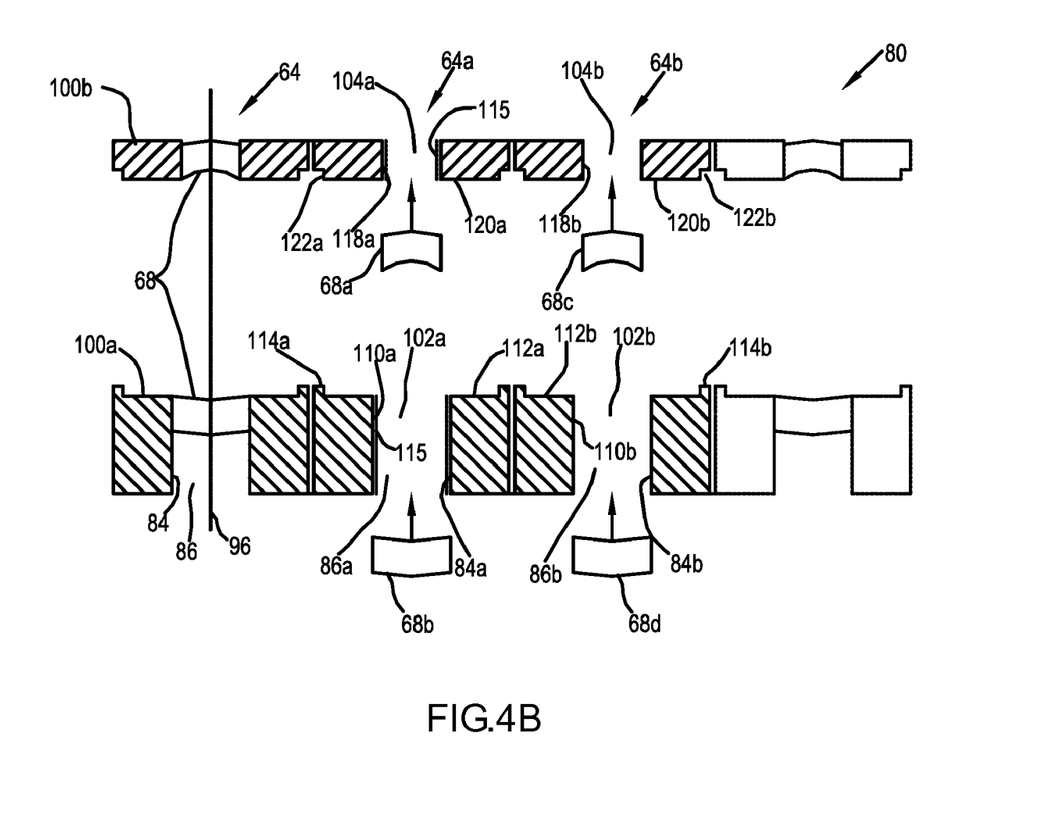
Figure 5:
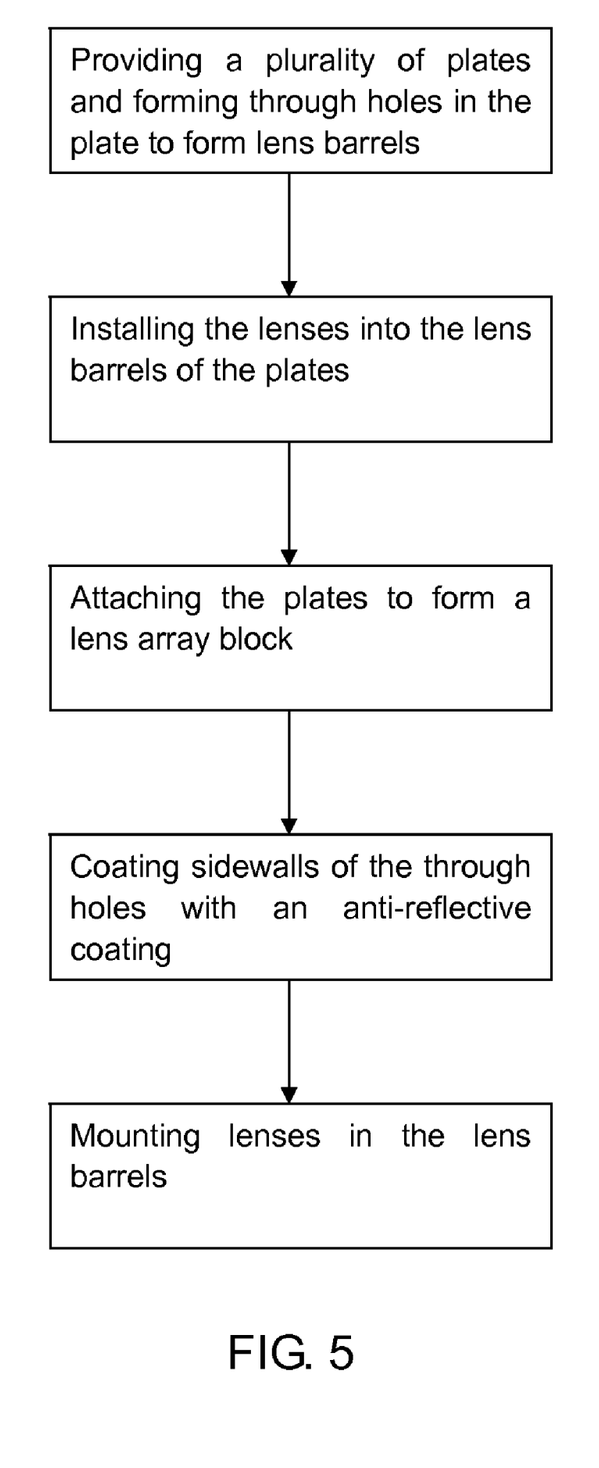
FIG. 5 is a flow chart of a method of fabricating the lens array block from a plurality of plates.

The lens array block 80 with the plurality of lens barrels 64a,b can be formed by a number of different methods. In one method, as illustrated in the flowchart of FIG. 5, the lens array block 80 is formed by forming through holes 86, 86a,b, for example, by drilling or etching, into a plurality of plates 100a,b. The plates 100a,b can be made, for example, from glass, ceramic, metal, heat-resistant plastic, or any of the other materials previously described. A plurality of first through holes 102a,b each having a first diameter are formed in a first plate 100a, and a plurality of second through holes 104a,b is formed in a second plate 100b, the second through holes 104a,b each having a second diameter which is smaller than the first diameter as shown in FIG. 4B. The diameters of the first and second through holes 102, 104, respectively, depend on the selected diameters for the lenses 68. In one example, the second diameter is selected to be smaller than the first diameter by at least 10%, or even by 30%. In one example, the first diameter is from about 0.6 mm to about 3.0 mm, and the second diameter is from about 0.5 mm to about 2.7 mm. These different diameters facilitate positioning of the lenses 68 in the lens barrel 64, and also allow optimized optical properties for the external image that is transmitted through the lens barrels 64.

A alignment system can also be used to align the first and second plates 100a,b to one another to form the lens array block 80. The first plate 100a has a plurality of first sidewalls 110a,b, each of which extend around a first through hole 102a,b. The first sidewalls 110a,b each have a top surface 112a,b with a circumferential protrusion 114a,b that wraps around a circumference of the top surfaces 112a,b. The circumferential protrusion 114 can be shaped as a ridge having a U-shaped cross-section. The second plate 100b also has a plurality of second sidewalls 118a,b, each of which surrounds a second through hole 104a,b. The second sidewalls 118a,b have a wall thickness that is from about 10% to about 30% larger than the first sidewalls 110a,b. The second sidewalls 118a,b have a bottom surface 120a,b with a circumferential slot 122a,b that is shaped as a U-shaped groove and which is sized to receive the U-shaped ridge of the first sidewalls 110a,b. The ridge and groove assemblies serve as a key to properly orient the two plates 100a,b together so that the first and second holes 86a,b have a common and aligned central axis 96a,b, which also serves to align the first and second lenses 68a,b and 68c,d to one another. At this stage, the lens barrels 64a,b with the assembled lenses 68a-d form completed lens modules 60, 60a,b. The lens array block 80 can then be cut to form separate lens modules 60a,b that each contain a lens barrel 64a,b with one or more aligned lenses 68a-d, or the entire lenses array block 80 can be used to assembly an image capturing unit array 50.

After the through holes 86a,b are completed, an anti-reflective coating 115 can be formed on the sidewalls 110a,b and 118a,b of each through hole 86a,b. A suitable anti-reflective coating 115 comprises a layer, or a stack of layers of light absorbing material. The anti-reflective coating 115 can be applied by vapor deposition, or spray painting, or sputtering, or by oxidation of the surface of the material. The anti-reflective coating 115 can be formed to a thickness of at least about 50 microns, or even a thickness of from about 1 micron to about 100 microns.

Lenses 68a-d are then mounted in the through holes 86a,b of each lens barrel 64a,b. First lenses 68b,d having first diameters are mounted in the through holes 102a,b to contact the sidewalls 110a,b; and second lenses 68a,c having second diameters are mounted in the through holes 104a,b to contact the sidewalls 118a,b. The lenses 68a-d can be made of a transparent material, such as glass, polymer, or other materials. In one method, the lenses 68a-d are made of glass, which is molded into a suitable shape. The glass lenses 68a-d are typically more stable at high temperature environments than plastic lenses.

Figure 6:
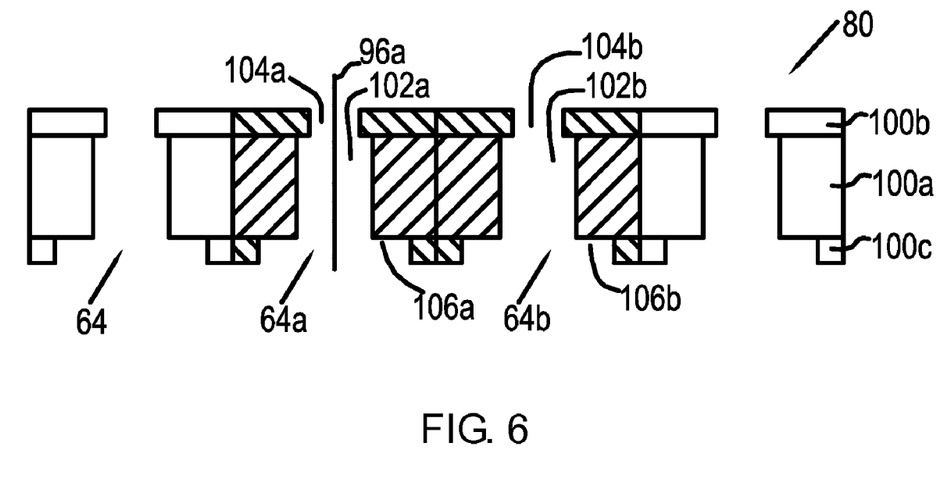
FIG. 6 is a schematic sectional side view of a lens array block showing the stepped cylindrical chamber that forms the lens barrel, which is formed by joining the first, second and third plates.

Additional plates 100 can be used to increase the number of diameters within the lens barrel 64. For example, a plurality of third through hole 106a,b each having a third diameter can be formed in a third plate 100c, as shown in FIG. 6, the third diameter being larger than the first diameter. Additional plates 100 are used to when the lens barrel 64 needs to accommodate more than one lens 68, and each lens has a different diameter, so that each of these diameters can be drilled or etched in a separate plate 100a-c. The diameter of the third through holes 106 also depends on the selected diameters for the different lenses 68 placed into each lens barrel 64a,b. In one example, the third diameter is selected to be larger than the first diameter by at least 5% or even 10%.

The first and second plates 100a,b, and the optional third plate 100c, can have the same or different thicknesses. For example, in one version, the second and third plates 100b,c, respectively, are sized less than 600 microns, and the first plate 100a is thicker and sized less than about 1600 microns. For example, the second and third plates 100b,c, respectively, can each have a thickness of from about 200 to about 540 microns, and the first plate 100a can have a thickness of from about 1100 to about 1580 microns. After drilling or etching, the first through holes 102a are aligned to the second through holes 104a so that a pair 105 of first and second through holes 102a, 104a, respectively, have a common central axis 96a. The optional third plate 100c with the third through holes 106a is also aligned to the same common central axis 96a. Thereafter, the first, second and third plates 100a-c are joined to one another by an adhesive to form a lens array block 80 comprising three-dimensional unitary structure that contains a plurality of lens barrels 64a,b.

The lens array block 80 can be fabricated by wet or dry etching the plates 100a-c to form the plurality of through holes 102,104,106 in the plates. For example, a suitable wet etching process for etching the through holes 102,104,106 in the plates 100a-c comprises masking each plate 100a-c with a specific mask pattern, and dipping the plate 100a-c in an acidic etchant, such as a dilute solution of HF. The mask pattern (not shown) can comprise a plurality of solid circles. A suitable dry etching process comprises forming a mask pattern on a plate 100a-c, forming a plasma of a fluorine-containing gas and etching the plate 100a-c in the plasma. The mask pattern can be formed with an etch resistant material, such as photoresist or hard mask. The through holes 102,104, 106 can also be drilled through the plates 100a-c using a conventional mechanical drill.

A laser drill can also be used to drill the through holes 102,104,106 through the plates 100a-c. A suitable laser comprises a $CO_2$ or pulsed laser, such as Nd:YAG laser or excimer laser. The laser can be used to form holes 102,104,106 in plates 100a-c made of glass or ceramic materials, such as silicon oxide, aluminum oxide, quartz, aluminum nitride, and other such high temperature materials. Advantageously, the high temperature materials can withstand high temperatures during processing, providing ease of fabricating the lens array block 80 and the resultant image capturing units 54.

Figure 7:
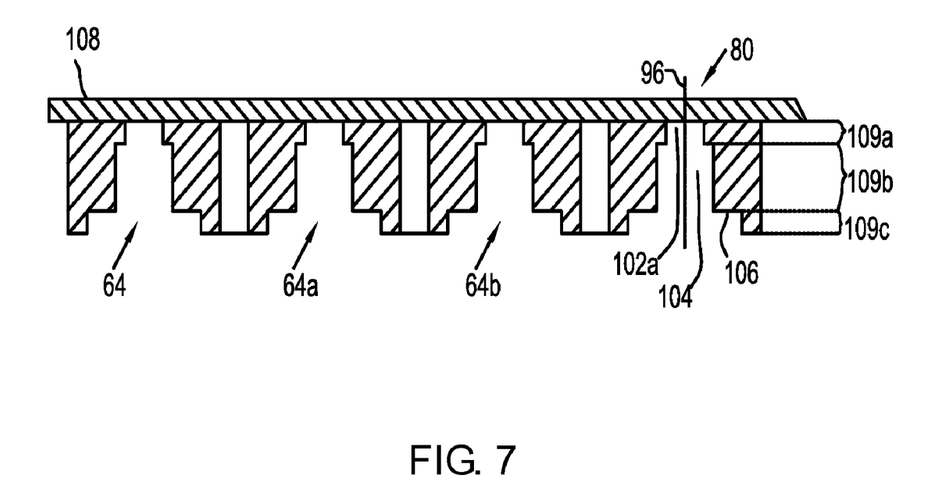
FIG. 7 is a schematic sectional side view of a lens array block fabricated by lithography electroforming micro-molding (LIGA) on a backing plate.

In another method of fabricating the lens array block 80, lithography electroforming micro-molding (LIGA) is used to form the through holes 102,104,106, as shown in FIG. 7. In this process, a suitable backing plate 108 is selected, such as for example, the backing plate 108 made of glass or metal. In a first stage of the process, lithography is used to form a first mask pattern comprising an array of first solid circles (not shown) having a first diameter on the exposed surface of the backing plate 108. The lens barrel material is then deposited by electrolysis around the first solid circles to form a first lens barrel level 109a containing first holes 102. A second mask pattern comprising an array of second solid circles (not shown) having a second diameter is then formed on the exposed surface of the first lens barrel level 109a. Another electrolysis step is used to deposit lens barrel material around the second solid circles to form a second lens barrel level 109b containing the second holes 104. The second holes 104 are aligned to and have a common central axis 96 with the first holes 102. Optionally, this process can be repeated to form a third lens barrel level 109c containing third holes 106 which have the same common central axis 96 with the first and second holes 102,104, respectively. The resultant lens array block 80 forms a three-dimensional unitary structure. A suitable electroforming process comprises suspending the baseplate 108 in a solution of nickel sulfamate, with or without cobalt sulfamate, and applying a current across the baseplate 108 and another electrode (not shown), which is also suspended in the solution. The resultant electrolytic process deposits Ni—Co or Ni material from the solution, and optionally also from the electrode which can be made from the same material, onto the backing plate 108.

Figure 8:
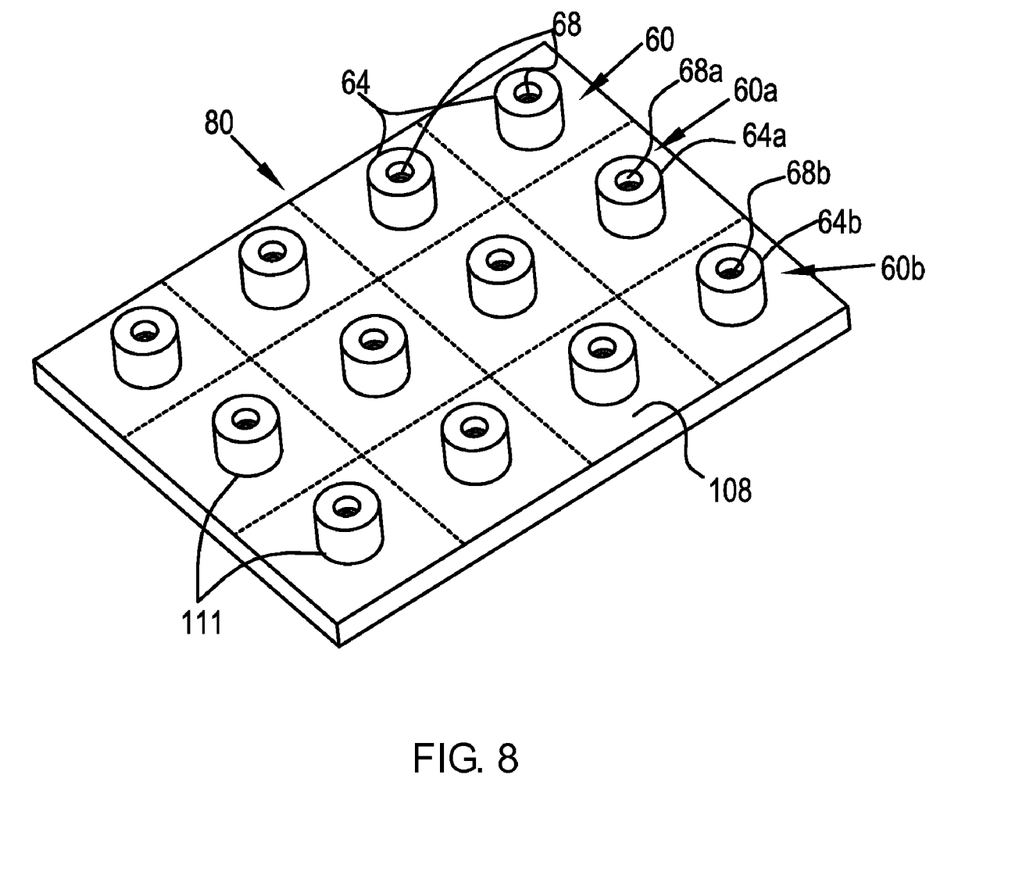
FIG. 8 is a schematic perspective view of a lens array block comprising a plurality of cylindrical lens barrels mounted on a backing plate.

Advantageously, the lens array block 80 can be used to efficiently assemble all the different components of an optical lens module 60. For example, the lens array block 80 can be adhered to a backing plate 108, as shown in FIG. 8, which serves to support the lens modules 60 during separation of the lens modules 60 from the lens array block 80. In this version, the lens barrels 64, 64a,b are spaced apart and separated from one another and located in a periodic arrangement across the plate 108. The lens barrels 64,64a,b extend outwardly from the backing plate 108, and are shaped as cylinders 111. One or more lenses 68 and other elements, such as mechanical or electromechanical shutters, or a lens which focal length can be adjusted by electro wetting techniques, can also be assembled into each lens barrel 64, while the array of lens barrels 64 are still joined together at their side surfaces. After assembly of a lens 68 into a lens barrel 64, the lens 68 is fixed and tested for optical alignment and accuracy. This facilitates the fabrication process by allowing simultaneous assembly of a plurality of lens modules 60. Before or after all the lens module 60 are assembled, the individual modules can be separated from one another. However, after fabrication of the lens array block 80, a plurality of lenses 68, 68a,b, can be assembled more easily and by an automatic machine into the plurality of lens barrels 64, 64a,b, that remain joined on the backing plate 108 because the lens barrels are arranged in a periodic distribution with a set spacing between them. This arrangement also facilitates fabrication of an image capturing unit array by allowing manipulation of the backing plate 108 with assembled lens modules 60, 60a,b onto an image sensor array 70 which has a plurality of image sensors 56a,b which are also spaced apart from one another in a periodic arrangement which is selected to match the arrangement of the lens barrels 64, 64a,b. While simultaneous assembly is generally more efficient, the fabricated lens barrels 64 can also be separated from one another prior to assembly of lenses 68 and other components into each lens barrel 64, and the separates lens modules 60, 60a,b can be assembled onto separate image sensors 56 to form individual image capture units.

Figure 9:
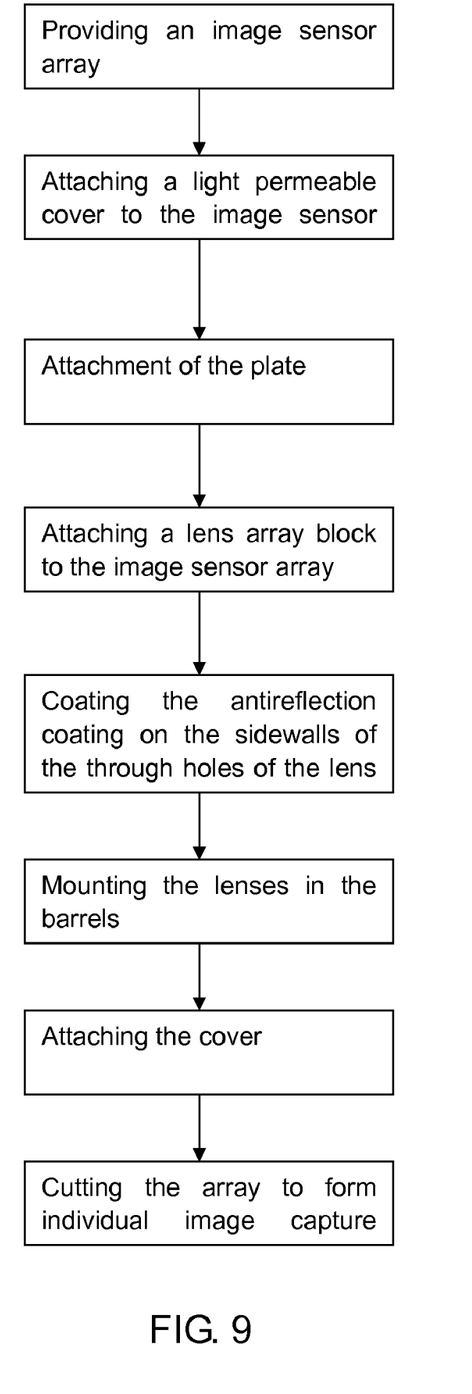
FIG. 9 is a flow chart of a method of manufacturing an image capture unit using an image sensor plate.

A method of assembling an image capture unit array 50 of FIG. 2, using an image sensor array 70 and a lens array block 80, is illustrated in the flow chart of FIG. 9. In a first step, a light permeable cover 74a is attached over the image sensor array 70 to protect the image sensors 56 or filter light entering the image sensor 56a,b. In this method, a lens array block 80 with completed lens barrels 54 or even or completed lens modules 60, can be used. Thus, the lens barrels 64 can be formed in situ over the light permeable cover 74, provided as a lens block array 80 which is attached to the cover 74, or provided as individual lens barrels 64 which are attached to the cover 74 a separate structures. The lens array block 80 is formed or positioned in relation to an image sensor array 70 to align the through holes 86a,b of each lens module 60a,b to the image receiving surfaces 58a,b of each image sensor 56a,b so that the image receiving surfaces 58a,b of each image sensor 56a,b is directly below the through hole 86a,b. A lens array block 80 is then aligned, and attached to the light permeable cover 74 by an adhesive, such as a resin, for example, an epoxy resin. Each image sensor 56a,b is now attached to a lens module 60a,b to form separable image capturing units 54a,b which are joined together in an image capturing unit array 50.

In one version, a preform (not shown) for forming the lens array block 80 such as a monocrystalline silicon wafer, is joined to the light permeable cover 74, and then etched, drilled or otherwise processed to form the through holes 86 of each lens barrel 64. After attaching the lens array block 80 to the light permeable cover 74, a small circular portion of the light permeable cover 74 is exposed at the bottom of each through hole 86 of each lens barrel 64, and these circular portions are each aligned to an image sensor 56 on the image sensor plate 130. After the through holes 86a,b are formed, an anti-reflective coating 115 can be formed on the sidewalls 110a,b and 118a,b of each through hole 86a,b as shown in FIG. 4B. Thereafter, one or more lenses 68 are mounted in the lens barrels 64. The mounted lenses 68a-d are fixed and tested by conventional methods. Such tests may include an alignment test and an image focusing test.

After the lenses 68 are positioned in each lens barrel 64 of the lens array block 80, a mask cover 130 is placed on the lens array block 80, as shown in FIG. 2, and attached with an adhesive. The mask cover 130 has a plurality of apertures 134a,b each of which are aligned with a lens barrel 64a,b of the lens array block 80. Each aperture 134a,b is an opening having a diameter which is smaller than the diameter of the adjacent through hole 86a,b so that a circumferential edge 136a,b of each of the lenses 68a,c is shielded by an edge portion 138a,b of the mask cover 130 surrounding the aperture 134a,b. The apertures 134a,b in the mask cover 130 allows radiation to pass through, but the edge portion 138a,b around each opening blocks the radiation from the circumferential edge 136a,b of each lens 68a,c. The resultant structure forms a plurality of individual image capturing units 54a,b. The sidewalls of the mask cover 130 can also have an antireflective coating 115 as described above.

After fabrication of the image capturing unit array 50, the individual image capturing units 54 can be separated from one another by a cutting process. Suitable cutting processes include mechanical cutting, laser cutting or electrical discharge machining. In the cutting process, a cross-sectional cut is performed through the mask cover 130, lens array block 80, light permeable cover 74, and image sensor 56 along lines 140a-c, as for example, shown in FIG. 2, to obtain a plurality of separated image capturing units 54.

Figure 10:
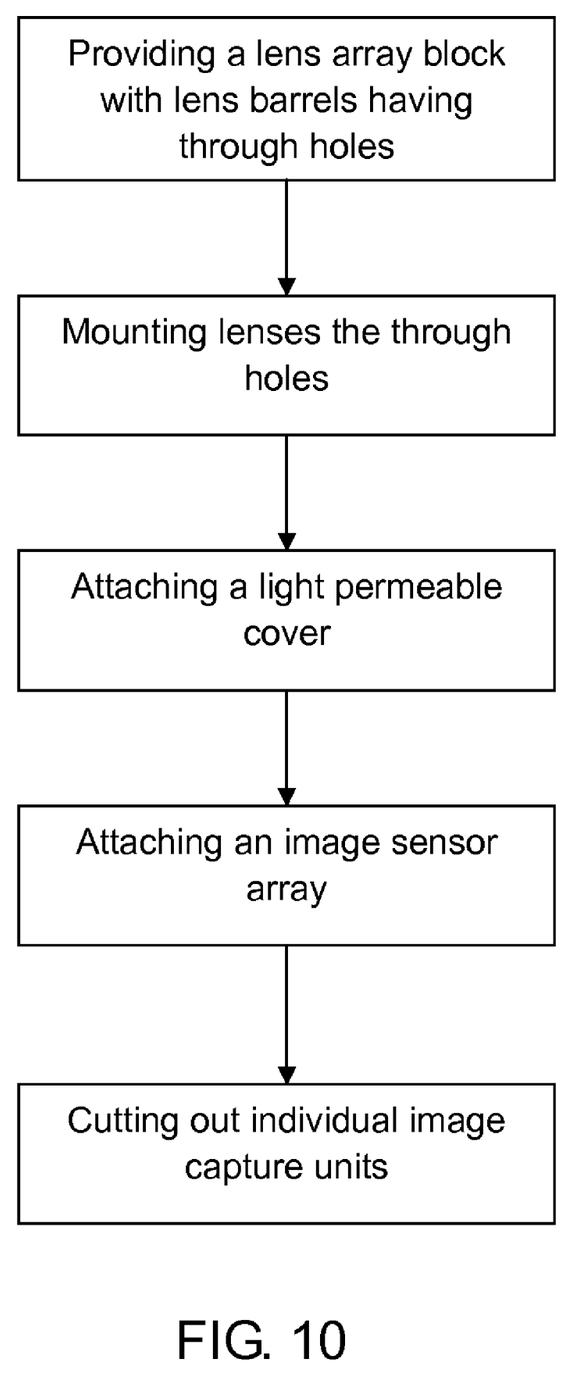
FIG. 10 is a flow chart of a method of manufacturing a plurality of image capture units using an image sensor plate and a plurality of lens modules.

Yet another method of fabricating a plurality of image capturing units 54 is shown in the flow chart of FIG. 10. In this method, a lens array block 80 with through holes 86 for lens barrels 64 is prefabricated. Lenses 68 are mounted in the lens barrels 64 before or after the lens array block 80 is attached to the light permeable cover 74. The lens array block 80 is then attached to a light permeable cover 74. Thereafter, the image sensor plate 130 and the mask cover 130 are aligned, and attached to, the preassembled lens array block 80 and light permeable cover 74. Separation of individual image capturing units 54 by cutting provides a final step.

The lens array block 80, lens barrel 64, lens module 60, and image capturing units 54 and the methods of manufacturing the same, allow production of these items with improved efficiency and higher yields resulting from this contamination. An entire array of lens modules 60 can be created as the lens array block 80 in a few steps with high device reliability and reproducibility. In addition, high temperature materials can be used to form the lenses 68 or the lens barrels 64. As result, a high quality, high precision, optical lens modules 60 and image capturing units 54 can be fabricated.

While illustrative embodiments of the lens array block, lens barrel and image capturing module are described in the present application, it should be understood that other embodiments are also possible. For example, lens barrel and lens array block designs can be used. Also, the lens module can be packaged with other types of image capturing modules, depending on the application. Thus, the scope of the claims should not be limited to the illustrative embodiments described herein.

What is claimed is:

1. A method of forming a lens array block, the method comprising:
   (a) providing a backing plate having a surface;
   (b) forming on the surface of the backing plate, a first mask pattern comprising an array of first solid circles;
   (c) depositing by electrolysis, lens barrel material around the first solid circles to form a first lens barrel level containing a plurality of first holes;
   (d) forming on the surface of the first lens barrel level, a second mask pattern comprising an array of second solid circles; and
   (e) depositing by electrolysis, lens barrel material around the second solid circles to form a second lens barrel level containing a plurality of second holes, each second hole having a common central axis with a first hole.

2. A method according to claim 1 further comprising:
   (f) forming on the surface of the second lens barrel level, a third mask pattern comprising an array of third solid circles that each have a third diameter; and
   (g) depositing by electrolysis, lens barrel material around the third solid circles to form a third lens barrel level containing a plurality of third holes, the third holes having a common central axis with the first and second holes.

3. A method according to claim 1 wherein (a) comprises providing a backing plate comprising glass or metal.

4. A method of fabricating an array of image capturing units, the method comprising:
   (a) fabricating a lens array block comprising a plurality of lens barrels, and top and bottom surfaces, as claimed in claim 1;
   (b) mounting at least one lens in each lens barrel of the lens array block, each lens barrel having a circumferential edge;
   (c) positioning a mask cover having a plurality of apertures over the top surface of the lens array block such that each aperture is aligned to a lens barrel to at least partially shield the circumferential edge of the lens in the lens barrel; and
   (d) attaching an image sensor array to the bottom surface of the lens array block such that an image receiving surface of each image sensor is aligned to a lens barrel.

5. A method according to claim 4 wherein (d) comprises positioning a light permeable cover between the image sensor array and the lens array block.

6. A method according to claim 4 further comprising cutting the array of image capturing units to form a plurality of separate image capturing units.

7. A method according to claim 4 comprising attaching the lens barrel block to the image sensor array with an adhesive.

8. A method according to claim 1 wherein (c) or (e) comprises depositing by electrolysis, lens barrel material comprising Ni—Co or Ni material.

9. A method according to claim 8 comprising suspending the backing plate and another electrode in a solution of nickel sulfamate, and applying a current across the backing plate and electrode.

10. A method according to claim 9 wherein the solution further comprises cobalt sulfamate.

11. A method according to claim 9 wherein the electrode comprises Ni—Co or Ni material.

12. A method according to claim 1 wherein (b) comprises forming an array of first solid circles that each have a first diameter, and (d) comprises forming an array of second solid circles that each have a second diameter.

13. A method according to claim 1 wherein (b) or (d) comprises forming the first mask pattern by lithography.

\* \* \* \* \*